US006787249B2

(12) United States Patent
Seo

(10) Patent No.: US 6,787,249 B2
(45) Date of Patent: Sep. 7, 2004

(54) ORGANIC LIGHT EMITTING ELEMENT AND LIGHT EMITTING DEVICE USING THE SAME

(75) Inventor: Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 20 days.

(21) Appl. No.: 10/107,631

(22) Filed: Mar. 27, 2002

(65) Prior Publication Data

US 2002/0142189 A1 Oct. 3, 2002

(30) Foreign Application Priority Data

Mar. 28, 2001 (JP) ........................................ 2001-094269

(51) Int. Cl.[7] .............................................. H05B 33/14
(52) U.S. Cl. ....................... 428/690; 428/917; 313/504; 257/102
(58) Field of Search ................................ 428/690, 917; 313/504; 257/102

(56) References Cited

PUBLICATIONS

Tanaka, M. et al, "Binuclear Metal Complexes XV. Copper (II) and Nickel (II) Complexes of Binucleating Ligands Derived from 3–Formyl–salicylic Acid and Diamines," Bull. Chem. Soc. Jpn., vol. 49, No. 9, pp. 2469–2473, Sep. 1976.

Tang, C.W. et al, "Organic Electroluminescent Diodes," Applied Physics Letters, vol. 51, No. 12, pp. 913–915, Sep. 21, 1987.

O'Brien, D.F. et al, "Improved Energy Transfer in Electrophosphorescent Devices," Applied Physics Letters, vol. 74, No. 3, pp. 442–444, Jan. 18, 1999.

Tsutsui, T. et al, "High Quantum Efficiency in Organic Light–Emitting Devices with Iridium–Complex as a Triplet Emissive Center," Japanese Journal of Applied Physics, vol. 38, part 2, No. 12B, pp. L 1502–L 1504, Dec. 15, 1999.

U.S. patent application No. 09/885,469 (pending) to Seo et al., including PTO filing receipt, specification, claims, abstract, and drawings.

*Primary Examiner*—Marie Yamnitzky
(74) *Attorney, Agent, or Firm*—Cook, Alex, McFarron, Manzo, Cummings & Mehler, Ltd.

(57) ABSTRACT

Low cost organic light emitting elements that are bright and have low electric power consumption, and an organic light emitting device using the organic light emitting elements, are provided. Organic light emitting elements capable of converting triplet state excitation energy into light emission are manufactured by applying a binuclear complex having triplet excitation state electrons to the organic light emitting elements. Further, a light emitting device is manufactured using the light emitting elements. Production costs are lowered by using a low cost metal as a central metal of the binuclear complex.

18 Claims, 10 Drawing Sheets

SF1-SF6:SUBFRAMES, $T_A$:WRITING PERIOD

ORGANIC LIGHT EMITTING ELEMENT AND LIGHT EMITTING DEVICE USING THE SAME

BACKGROUND OF THE INVENTION

1. Field of the Invention

The present invention relates to an organic light emitting element having an anode, a cathode, and a layer containing an organic compound in which light emission can be obtained by applying an electric field (hereafter referred to as an "organic compound layer"). In general, light emitted when returning to a base state from a singlet excitation state, and light emitted when returning to a base state from a triplet excitation state exist as organic compound light emissions generated by the application of an electric field. In particular, the present invention relates to organic light emitting elements using organic compounds in which light emission is capable of being generated from a triplet excitation state. Note that the term light emitting device in this specification indicates image display devices and light emitting devices using organic light emitting elements as light emitting elements. Further, modules in which a connector, for example an isotropic conductive film (flexible printed circuit, FPC), a TAB (tape automated bonding) tape, or a TCP (tape carrier package) is attached to organic light emitting elements are all included in the category of light emitting devices, as are modules in which a printed wiring board is provided in an end portion of TAB tape or TCP, and modules in which an IC (integrated circuit) is directly mounted to light emitting elements by a COG (chip on glass) method.

2. Description of the Related Art

Organic light emitting elements are elements which emit light by the application of an electric field. The light emitting mechanism is one in which electrons injected from a cathode recombine within an organic compound layer with holes injected from an anode, forming excited state molecules (hereafter referred to as "molecular excitons"), by the application of a voltage to the organic compound layer sandwiched between the electrodes. Energy is released when the molecular excitons return to a base state, emitting light.

The organic compound layer is normally formed by a thin film having a thickness less than 1 μm for these types of organic light emitting elements. Further, organic light emitting elements are self light emitting elements in which light is emitted by the organic compound layers, and therefore a back light like that used in a conventional liquid crystal display is not necessary. Consequently, the ability to manufacture light emitting elements that are extremely thin with light weight is a big advantage.

Furthermore, the period of time from the injection of a carrier until recombination occurs in an organic compound layer having a thickness on the order of 100 to 200 nm, for example, is on the order of several tens of nanoseconds when considering the carrier mobility of the organic compound layer. Even when including a period required for a process from when the carrier recombines until light is emitted, the light emission can be performed within order of microsecond. The light emitting elements therefore have a fast response speed.

In addition, drive using a direct current voltage is possible because the organic light emitting elements are carrier injecting light emitting elements, and therefore it is difficult for noise to develop. With regard to driving voltage, it has been reported (reference 1: Tang, C. W., and VanSlyke, S. A., "Organic Electroluminescent Diodes", Applied Physics Letters, Vol. 51, No. 12, pp. 913–5 (1987)) that a sufficient brightness of 100 cd/m$^2$ at 5.5 V was achieved by first taking an extremely thin film of an organic compound layer with a uniform film thickness on the order of 100 nm, selecting an electrode material so as to make the carrier injection barrier with respect to the organic compound layer smaller, and in addition, introducing a hetero structure (two layer structure).

Organic light emitting elements are therefore under the spotlight as next generation flat panel display elements due to their thin size, light weight, high speed response, and driving at D.C. voltage and low voltage. Further, light emitting elements are self light emitting and have a wide angular field of view, and therefore their visibility is comparatively good and they are considered to be effective as elements used in the display screens of portable devices.

It has already been stated that emitted light in organic light emitting elements is a phenomenon in which light is emitted when molecular excitons return to a base state, and it is possible for singlet excitation state (S*) and triplet excitation state (T*) molecular excitons to exist as molecular exciton types formed by organic compounds. Further, the statistical generation ratio in organic light emitting elements is considered to be S*:T*=1:3 (reference 2: Shirato, J., "Monthly Display Supplement, From Organic EL Display Fundamentals to the Latest Information" (TechnoTimes Corp.), p. 28–29).

However, for general organic compounds at room temperature, the emission of light from the triplet excitation state (T*) is not observed, and normally only light emitted from the singlet excitation state (S*) can be observed. The base state of organic compounds is a singlet base state ($S_0$), and therefore transitions from T* to $S_0$ (phosphorescence process) become prohibited transitions to a considerable degree and transitions from S* to $S_0$ (fluorescence process) become allowed transitions.

In other words, normally only the singlet excitation state (S*) contributes to light emission, and this is the same for organic light emitting elements. However, the theoretical limit of the internal quantum efficiency in organic light emitting elements (the proportion of photons generated with respect to the carrier injected) is 25% based on the fact that S*:T*=1:3.

Furthermore, the light emitted is not all emitted to the outside. A portion of the light cannot be extracted due to the component of the organic light emitting element (organic compound layer materials, electrode materials) and the index of refraction indigenous to the substrate material. The ratio of light extracted to the outside with respect to the light emitted is referred to as a light extraction efficiency. The light extraction efficiency is thought to be on the order of 20% for organic light emitting elements having a glass substrate.

For the above reasons, even if all of the injected carrier are able to form molecular excitons, the theoretical limit of the final ratio of photons extracted to the outside with respect to the number of injected carriers (hereafter referred to as an "external quantum efficiency") is 25%×20%=5%. That is, even if all of the carrier recombines, only 5% is extracted as light.

However, in recent years organic light emitting elements capable of converting energy emitted when returning to a base state from a triplet excitation state (T*) (hereinafter referred to as "triplet excitation energy") into an emission light have been announced one after another, their high light emission efficiency grabbing attention. (Reference 3: D. F.

O'Brien, M. A. Baldo, M. E. Thompson and S. R. Forrest, "Improved energy transfer in electrophosphorescent devices", Applied Physics Letters, vol. 74, No. 3, 442–444 (1999)). (Reference 4: Tetsuo TSUTSUI, Moon-Jae YANG, Masayuki YAHIRO, Kenji NAKAMURA, Teruichi WATANABE, Taishi TSUJI, Yoshinori FUKUDA, Takeo MAKIMOTO and Satoshi MIYAGUCHI, "High Quantum Efficiency in Organic Light-Emitting Devices with Iridium-Complex as a Triplet Emissive Center," Japanese Journal of Applied Physics, Vol. 38, pp. L1502–L1504 (1999)).

An organometallic complex having platinum as a central metal (hereafter referred to as a "platinum complex") is used in reference 3, while an organometallic complex having iridium as a central metal (hereafter referred to as an "iridium complex") is used in reference 4. Both organometallic complexes are characterized by their introduction of a tertiary transition element as a metal center. Of course, materials do exist that exceed the theoretical limiting value of 5% for the external quantum efficiency discussed above.

As shown in reference 3 and in reference 4, organic light emitting elements that use organic compounds capable of converting triplet excitation energy into light emission (hereafter referred to as "triplet light emitting materials") can achieve an external quantum efficiency that is higher than the conventional one. If the external quantum efficiency becomes higher, then the brightness of emitted light also increases. It is therefore considered that organic light emitting elements using triplet light emitting materials will occupy a large amount of future development as means of achieving high brightness light emission and light emitting efficiency.

However, platinum and iridium are both so-called precious metals, and therefore platinum and iridium complexes using these metals are also high cost, and it is anticipated that this will have a harmful influence on future cost reductions. Further, these metals are both scarce metals, and are therefore difficult to supply for mass production.

The platinum complex and the iridium complex are organometallic complexes in which the central metal and the ligand benzene ring are σ-bonded by direct bonding. A long period of time is required for synthesis, and the yield is poor, and therefore these complexes are not good for productivity. From the standpoint of productivity, Werner complexes such as tris(8-quinolinolate) aluminum (hereafter referred to as "Alq$_3$"), often used in organic light emitting elements, are generally thought to be effective.

In addition, the color of light emitted by the iridium complex is green, namely an intermediate wavelength in the visible light region. If the platinum complex is used as a dopant, the light emitted has a red color with relatively good color purity. However, the host material also emits light, and there is a disadvantage in that the color purity becomes poor if the concentration is low. For cases in which the concentration is high, a disadvantage exists in that there is concentration quenching, and therefore the light emission efficiency drops. In other words, high efficiency emission of high color purity red color and blue color light cannot be obtained from organic light emitting elements capable of converting triplet excitation energy into light emission.

Considering the future manufacture of a full color flat panel display using light emission in red, green, and blue colors, it is therefore necessary to achieve mass production using low cost raw materials which have a high external quantum efficiency, similar to that of the platinum complex or the iridium complex, and which give high color purity red color and blue color light emissions.

From the above discussion, other than for existing organic metal complexes using platinum or iridium, there is arisen an indispensable necessity for the development of triplet light emitting materials.

SUMMARY OF THE INVENTION

The present invention has been made in view of the above, and an object of the present invention is to provide a triplet light emitting material which is manufactured at lower cost than conventional triplet light emitting materials. Further, another object of the present invention is to provide an organic light emitting element which has a higher light emission efficiency, and can be manufactured at lower cost, than conventional light emitting elements by using the light emitting material of the present invention.

In addition, still another object of the present invention is to provide a low cost light emitting device that is bright and has low electric power consumption by using an organic light emitting element having a high light emission efficiency obtained by implementing the present invention. Still another object of the present invention is to provide electronic equipment using the light emitting device.

The heavy atom effect is well known in the photoluminescence field as a method of converting triplet excitation energy light emission. The heavy atom effect is a phenomenon in which the spin-orbit interaction becomes larger, and phosphorous light emission, a prohibited transition (T* to $S_0$), is promoted by introducing heavy atoms into molecules having light emitting properties, or by placing heavy atoms around the periphery of solvent or the like having a melted light emitting material. Note that the term heavy atom as used here indicates atoms possessing a large atomic nucleus weight (corresponding to atomic number, that is the number of positive electric charges in the atomic nucleus).

Platinum and iridium are heavy atoms which can develop the spin-orbit interaction, and effectively promote phosphorescence. In this respect, the platinum complex and the iridium complex discussed above can be said to be extremely effective triplet light emitting materials.

However, the effectiveness of the heavy atom effect is determined by a spin-orbit coupling coefficient, which is characteristic to each atom, and therefore the atoms used in order to cause the heavy atom effect are very limited. Many raw materials and the like containing these atoms are high cost.

A method of converting triplet excitation energy into light emission without the use of heavy atoms is thus preferable. Conceptually, transitions from a triplet excitation state to a base state should be allowed transitions. In other words, it is thought that triplet excitation energy can be converted into light emissions provided that the base state is a triplet state. For example, the base state becomes a triplet state provided that the highest occupied molecular orbital (HOMO) is degenerate, as with oxygen molecules.

Normally this type of state is not seen in hydrocarbon compounds, but it is possible to form a triplet state in energy levels of the central metal of metallic complexes. Binuclear complexes having paramagnetic metals as central metals (metal complexes having two central metals) can be given as an example.

A phenomenon is seen in binuclear complexes having paramagnetic metals as central metals in which unpaired electrons of the paramagnetic metals often couple within the complex, and a ferromagnetic or antiferromagnetic interaction develops. The electrons are considered to be in a triplet state for the ferromagnetic interaction case. Furthermore, although the electrons are in a singlet state for the antiferromagnetic case, they will be in a triplet state at a certain temperature or above (reference 5: Fundamental Complex Engineering Research Society, "Complex Chemistry: Fundamentals and Latest Topics" (Kodansha), pp. 48–9).

By triplet state electrons thus formed contributing to the emission of light, the transformation of triplet excitation energy into light emission is considered to be possible. The applicants of the present invention have focused upon applying binuclear complexes as light emitting materials for organic light emitting elements.

Furthermore, the applicants of the present invention consider that the total atomic weight becomes very large in accordance with a plurality of central metals being in contact and forming a cluster state, and thus that there is a substantial possibility of causing an effect similar to the heavy atom effect. This is also a reason for focusing upon binuclear complexes.

In addition, the excitation energy state changes in accordance with changing the combination of the central metals if a binuclear complex is used, and therefore it is considered that the color of light emitted can be changed to a certain extent. Namely, there is an advantage in that tuning of the color of light emitted becomes possible without changing the ligands.

From this background, a binuclear complex possessing luminescent ligands is used in the organic light emitting elements in the present invention. Note that, although Werner complexes are used in the present invention due to their ease of synthesis and good productivity, the use of organometallic complexes in which a central metal and carbon atom ligands are directly bonded can be considered to achieve better characteristics. This can be seen strikingly for the iridium complex.

The binuclear complexes used in the present invention can be expressed by general formulae 1 to 4, shown below.

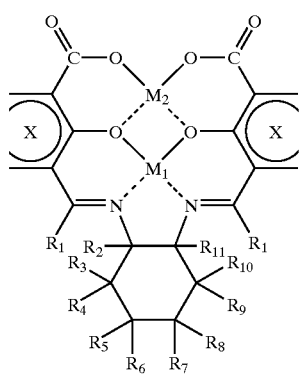

(1)

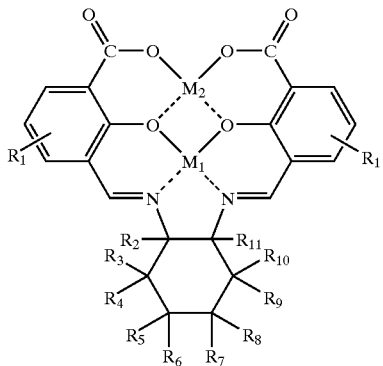

(2)

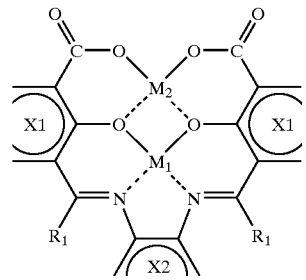

(3)

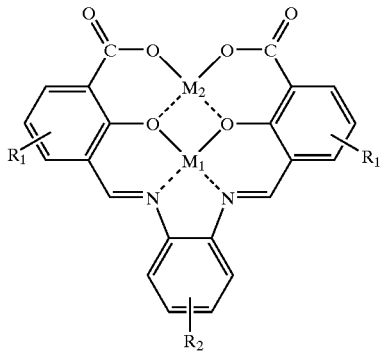

(4)

In general formula 1, M1 and M2 denote bivalent metallic ions or bivalent oxo-metallic ions. Further, X denotes a benzene ring or a fused ring made from a benzene ring, which may have substituents. R1 denotes hydrogen or an alkyl group; and R2 to R11 each denote hydrogen or an alkyl group, and R2 to R11 may all be identical, or may be different.

In general formula 2, M1 and M2 denote bivalent metallic ions or bivalent oxo-metallic ions. R1 denotes hydrogen, an alkyl group, an alkoxyl group, or aryl group. R2 to R11 each denote hydrogen or an alkyl group, and R2 to R11 may all be identical, or may be different.

In general formula 3, M1 and M2 denote bivalent metallic ions or bivalent oxo-metallic ions. R1 denotes hydrogen or an alkyl group. Further, X1 and X2 each denote a benzene ring or a fused ring made from benzene. X1 and X2 may each be identical, or may be different, and each may have substituents.

In general formula 4, M1 and M2 denote bivalent metallic ions or bivalent oxo-metallic ions. R1 and R2 each denote hydrogen, an alkyl group, an alkoxyl group, or aryl group, and R1 and R2 may be identical, or may be different.

DETAILED DESCRIPTION OF THE PREFERRED EMBODIMENTS

Embodiment Mode

Figure 1A:
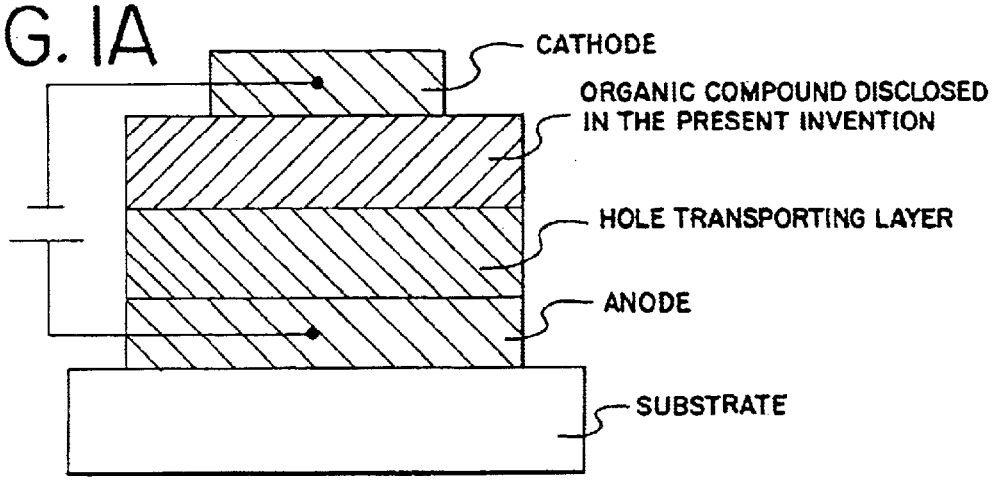
FIGS. 1A and 1B are diagrams showing the structure of an organic light emitting element.

First, methods for synthesizing dinuclear complexes disclosed by the present invention are discussed. Dinuclear complex synthesis methods of this kind are established. (Reference 6: Mitsunori TANAKA, Michiyo KITAOKA, Hisashi OKAWA, and Sigeo KIDA, "Binuclear Metal Complexes. XV. Copper (II) and Nickel (II) Complexes of Binucleating Ligands Derived From 3-Formyl-salicylic Acid and Diamines", Bull. Chem. Soc. Jpn., vol. 49(9), 2469–2473 (1976)). In reference 6, dinuclear complex ligands are formed by reacting 3-formyl-salicylic acid with diamine, applying thereon a central metal raw material, thereby performing synthesis of a binuclear complex.

The aforementioned procedure may be applied when synthesizing the dinuclear complex of the present invention. For example, in order to synthesize a dinuclear complex of general formula 2, the ligands of general formula 2 can be obtained by reacting a 3-formyl-salicylic acid derivative with a 1,2-cyclohexane diamine derivative. General formula 1 is a more generalized version of general formula 2, and it is possible to synthesize a dinuclear complex of general formula 1 by using a similar reaction.

Further, in order to synthesize a dinuclear complex of general formula 4, the ligands of general formula 4 can be obtained by reacting a 3-formyl-salicylic acid derivative with a 1,2-phenylene diamine derivative. General formula 3 is a more generalized version of general formula 4, and it is possible to synthesize a dinuclear complex of general formula 3 by using a similar reaction.

Next, an explanation relating to the introduction of central metals and substituents in general formulae 1 to 4 is discussed.

The ligands of the dinuclear complexes disclosed by the present invention can all have their tendency for coordinating in a planar shape strengthened with the use of cyclohexylene groups or phenylene groups. In particular, the tendency for planar coordination can be strengthened when the dinuclear complex has the cyclohexylene group (general formulae 1 and 2) by using a cis-1,2-cyclohexane diamine derivative as a raw material.

It is therefore possible to have planar coordination even if, for example, a metal such as zinc, which easily coordinates tetrahedrally, is selected as the central metal. That is, it is possible for M1 and M2 to coordinate provided that they are bivalent metallic ions. However, it is preferable to use metallic ions having a strong tendency for planar coordination as M1 and M2; group 9 to group 11 elements such as cobalt, nickel, and copper are suitable.

Further, it is also possible for M1 and M2 to coordinate when they are bivalent oxo-metallic ions ($MO^{2+}$). In this case, an atomic structure is obtained in which the oxygen atoms of the oxymetallic ions protrude out from the ligand plane. It is preferable to use group 4 to group 6 elements such as titanium, vanadium, and molybdenum as suitable elements for forming the oxymetallic ions.

Note that the organic compounds disclosed by the present invention have poor solubility with respect to various organic solvents for cases in which the compounds have no substituents. Considering things such as film formation by wet methods such as spin coating, and purification by recrystallization, alkyl groups and alkoxyl groups may therefore be introduced in order to increase molecular solubility. Furthermore, aryl groups may also be introduced with the goal of shifting the wavelength of emitted light to a longer wavelength.

An embodiment for manufacturing an organic light emitting element is discussed below. Use of the organic compounds disclosed by the present invention as light emitting materials of organic light emitting elements can be broadly divided into two categories. The first is a method for using the organic compounds as light emitting layers, as typified by FIG. 1A. The second is a method for using the organic compounds as dopants, as typified by FIG. 1B.

Note that although the organic compounds disclosed by the present invention are used in an electron transporting light emitting layer in FIG. 1A (single hetero structure), a light emitting layer may also be formed between a hole transporting layer and an electron transporting layer (double hetero structure). Further, although the organic compounds disclosed by the present invention are used in doping an electron transporting layer in FIG. 1B, they may also be used in doping a hole transporting layer. In addition, although an anode is formed on a substrate in FIGS. 1A and 1B, a structure in which a cathode is formed on the substrate may also be used.

The cyclohexane portions of the organic compounds of general formulae 1 and 2 are non-planar, but portions in which the ligands coordinate to the central metals are planar, as discussed above. Further, the organic compounds of general formulae 3 and 4 are planar over their entirety. The organic compounds disclosed by the present invention therefore have a molecular structure with overall high planarity.

Figure 1B:
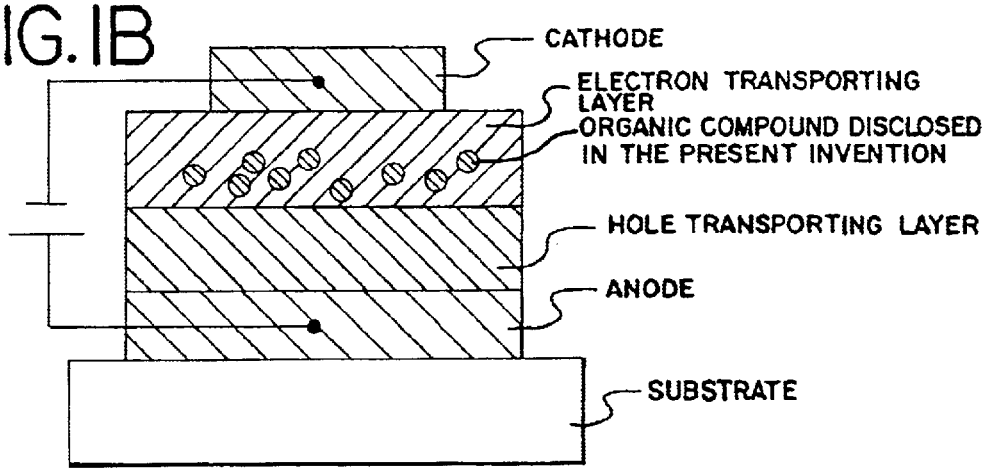

The molecular interaction is strong for the above-mentioned cases in which planarity of the molecule is high, and there is a strong possibility of lowering the light emitting characteristics due to concentration quenching for cases in which a single layer of the organic compound is formed. The method of using the organic compounds as dopants, as in FIG. 1B, is thus more preferable than the method of using the organic compounds as light emitting layers, as in FIG. 1A.

Embodiments

Embodiment 1

A specific example of a dinuclear complex of general formula 1 in the embodiment mode of the present invention is shown in Embodiment 1.

An organic compound of general formula 5 below is a dinuclear complex that uses two nickel atoms per molecule as central metals. The dinuclear complex of general formula 5 can be considered to have no magnetic interaction between the nickel atoms. However, a possibility that the total nuclear load may become very large due to the central metals being near to each other, forming a cluster state; and causing an effect substantially similar to the heavy atom effect was taken into consideration.

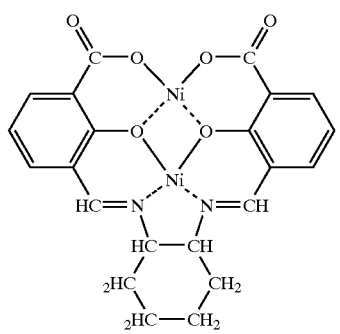

(5)

Further, an organic compound of general formula 6 below is a dinuclear complex in which a secondary copper ion is introduced to the M1 site, and an oxo-vanadium ion is introduced to the M2 site, as central metals. A strong magnetic interaction between the metals is at work in the dinuclear complex of the general formula 6 below, and therefore it can be considered that the efficiency of converting triplet excitation energy into light emission is increased.

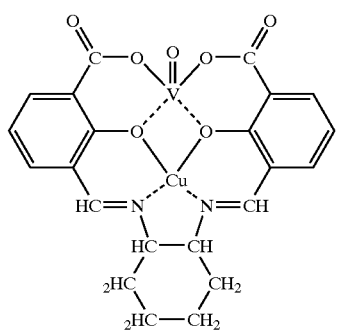

(6)

Embodiment 2

A specific example of a dinuclear complex of general formula 3 in the embodiment mode of the present invention is shown in Embodiment 2.

An organic compound of general formula 7 below is a dinuclear complex that uses two nickel atoms per molecule as central metals. The binuclear complex of general formula 7 below can be considered to have no magnetic interaction between the nickel atoms.

However, a possibility that the total nuclear load becomes very large due to the central atoms being near to each other, forming a cluster state, and causing an effect substantially similar to the heavy atom effect.

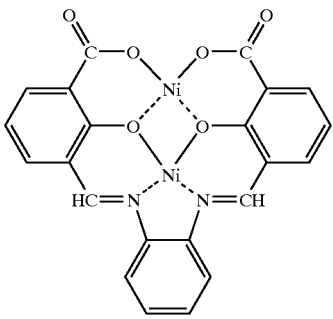

(7)

Further, an organic compound of general formula 8 below is a dinuclear complex in which a secondary copper ion is introduced to the M1 site, and an oxo-vanadium ion is introduced to the M2 site, as central metals. A strong magnetic interaction between the metals is at work in the dinuclear complex of general formula 8 below, and therefore it can be considered that the efficiency of converting triplet excitation energy into light emission is increased.

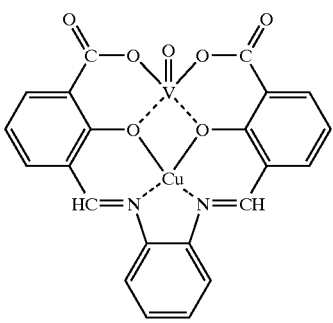

(8)

Embodiment 3

The organic compounds of the general formulae 1 to 4 shown by the embodiment mode of the present invention can be used as light emitting layers, or as dopants for light emitting layers, in organic light emitting elements. However, as discussed above, it is preferable to use the organic compounds as dopants from the standpoint of preventing concentration quenching. An element structure when using the organic compounds as dopants is shown in Embodiment 3.

Figure 2:
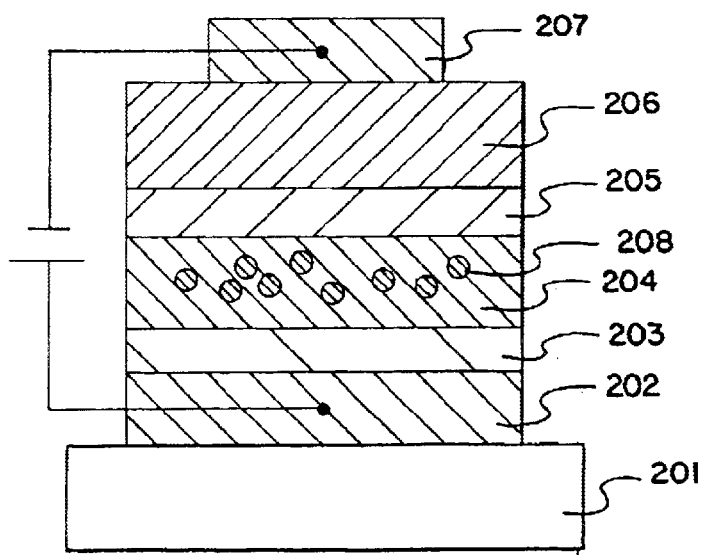
FIG. 2 is a diagram showing the structure of an organic light emitting element.

A typical element structure is shown in FIG. 2. FIG. 2 shows an element structure in which an anode 202, a hole injecting layer 203, a hole transporting layer 204, a hole blocking layer 205, an electron transporting layer 206, and a cathode 207 are laminated in order on a substrate 201. The organic compounds of the present invention are added to the hole transporting layer 204 as dopants 208. Note that although a structure in which the anode contacts the substrate is used here, an inverse structure in which the cathode is contacting the substrate may also be used.

There is a condition that the organic compounds of the present invention have a higher HOMO level, and a lower LUMO level, compared to their host material (the hole transporting layer 204 in FIG. 2. In particular, it is preferable if the light emission spectrum of the host material overlaps with the absorption spectrum of the organic materials of the present invention, for it is more effective. Note that although the organic compounds of the present invention are added to the hole transporting layer in Embodiment 3, they may also be added to the electron transporting layer or the light emitting layer.

A specific example of the element shown by FIG. 2 is shown here. First, an indium tin oxide (ITO) is formed as the anode 202 by sputtering on a glass substrate 201. In addition, a film is formed by spin coating of an aqueous solution of polyethylenedioxythiophene (hereafter referred to as "PEDOT") doped with polystyrene sulfonic acid (hereafter referred to as "PSS"), and baked, forming the hole injecting layer 203.

A poly(N-vinylcarbazole) (hereafter referred to as "PVK") that has versatility as the host because of its large excitation energy is used as the hole transporting layer 204. The alkyl-substituted composition (in order to increase solubility) of general formula 1 and PVK may therefore be dissolved in the same solvent, and the film formed by spin coating. The alkyl-substituted compound of general formula 1 becomes the dopant 208 at this point.

Next, in order to increase the recombination rate of the carrier in the hole transporting layer 204, 3-(4-tert-butylphenyl)-4-phenyl-5-(4-biphenyl)-1,2,4-triazole (hereafter referred to as "TAZ") is formed by vacuum evaporation as the hole blocking layer 205. In addition, $Alq_3$ is formed by vacuum evaporation as the electron transporting layer 206. Lastly, a film may be formed by vacuum evaporation from an Al:Li alloy for the cathode 207.

It thus becomes possible to manufacture an organic EL element by dispersing the organic compounds of the present invention throughout polymeric materials as shown in Embodiment 3.

Embodiment 4

Figure 3A:
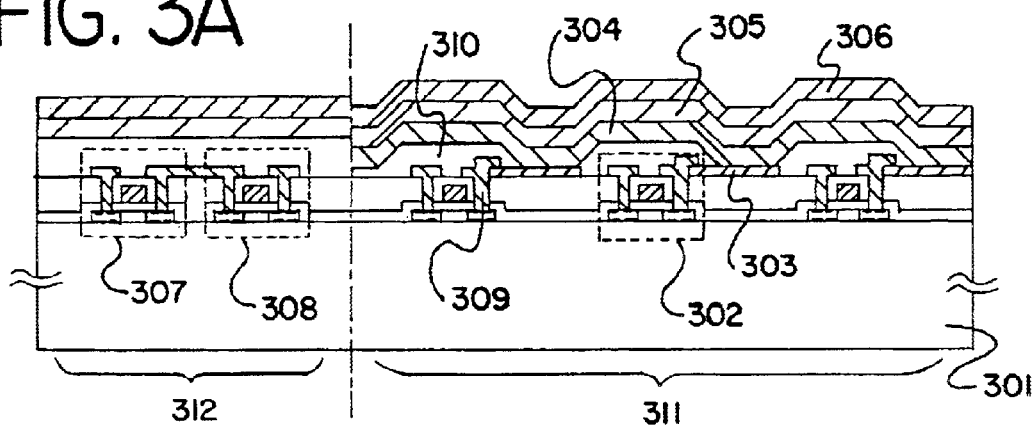
FIGS. 3A and 3B are diagrams showing the cross sectional structure of a light emitting device.
Figure 3B:
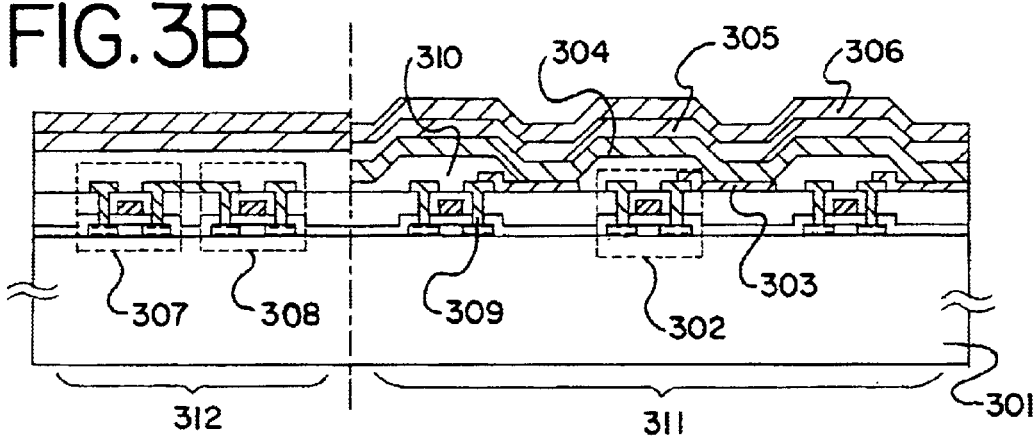

This embodiment describes a light emitting device that includes an organic light emitting element according to the present invention. FIGS. 3A and 3B are sectional views of an active matrix light emitting device that uses an organic light emitting element of the present invention.

A thin film transistor (hereinafter referred to as TFT) is used here as an active element, but the active element may be a MOS transistor. The TFT shown as an example is a top gate TFT (planar TFT, to be specific), but a bottom gate TFT (typically a reverse stagger TFT) may be used instead.

In FIG. 3A, 301 denotes a substrate. The substrate used here can transmit visible light so that light is sent to the outside from the substrate side. Specifically, a glass substrate, a quartz substrate, a crystal glass substrate, or a plastic substrate (including a plastic film) can be used. The substrate 301 refers to the substrate plus an insulating film formed on the surface of the substrate.

On the substrate 301, a pixel portion 311 and a driving circuit 312 are provided. The pixel portion 311 will be described first.

The pixel portion 311 is a region for displaying an image. A plurality of pixels are placed on the substrate, and each pixel is provided with a TFT 302 for controlling a current flowing in the organic light emitting element (hereinafter referred to as current controlling TFT), a pixel electrode (anode) 303, an organic compound film 304, and a cathode 305.

Although only the current controlling TFT is shown in FIG. 3A, each pixel has a TFT for controlling a voltage applied to a gate of the current controlling TFT (hereinafter referred to as switching TFT).

The current controlling TFT 302 here is preferably a p-channel TFT. Though an n-channel TFT may be used instead, a p-channel TFT as the current controlling TFT is more successful in reducing current consumption if the current controlling TFT is connected to the anode of the organic light emitting element as shown in FIGS. 3A and 3B. Note that, the switching TFT may be formed by either an n-channel TFT or a p-channel TFT.

A drain of the current controlling TFT 302 is electrically connected to the pixel electrode 303. In this embodiment, a conductive material having a work function of 4.5 to 5.5 eV is used as the material of the pixel electrode 303, and therefore the pixel electrode 303 functions as the anode of the organic light emitting element. A light-transmissive material, typically, indium oxide, tin oxide, zinc oxide, or a compound of these (ITO, for example), is used for the pixel electrode 303. On the pixel electrode 303, the organic compound film 304 is formed.

On the organic compound film 304, the cathode 305 is provided. The material of the cathode 305 is desirably a conductive material having a work function of 2.5 to 3.5 eV. Typically, the cathode 305 is formed from a conductive film containing an alkaline metal element or an alkaline-earth metal element, or from a conductive film containing aluminum, or from a laminate obtained by layering an aluminum or silver film on one of the above conductive films.

A layer composed of the pixel electrode 303, the organic compound film 304, and the cathode 305 is covered with a protective film 306. The protective film 306 is provided to protect the organic light emitting element from oxygen and moisture. Materials usable for the protective film 306 include silicon nitride, silicon oxynitride, aluminum oxide, tantalum oxide, and carbon (specifically, diamond-like carbon).

Next, the driving circuit 312 will be described. The driving circuit 312 is a region for controlling timing of signals (gate signals and data signals) to be sent to the pixel portion 311, and is provided with a shift register, a buffer, and a latch, as well as an analog switch (transfer gate) or level shifter. In FIG. 3A, the basic unit of these circuits is a CMOS circuit composed of an n-channel TFT 307 and a p-channel TFT 308.

Known circuits structures can be applied to the shift register, the buffer, the latch, and the analog switch (transfer gate) or level shifter. Although the pixel portion 311 and the driving circuit 312 are provided on the same substrate in FIGS. 3A and 3B, IC or LSI may be electrically connected to the substrate instead of placing the driving circuit 312 on the substrate.

The pixel electrode (anode) 303 is electrically connected to the current controlling TFT 302 in FIGS. 3A and 3B but the cathode may be connected to the current controlling TFT instead. In this case, the pixel electrode is formed from the material of the cathode 305 whereas the cathode is formed from the material of the pixel electrode (anode) 303. The current controlling TFT in this case is preferably an n-channel TFT.

The light emitting device shown in FIG. 3A is manufactured by a process in which formation of the pixel electrode 303 precedes formation of a wiring line 309. However, this process could roughen the surface of the pixel electrode 303. The roughened surface of the pixel electrode 303 may degrade characteristic of the organic light emitting element since it is a current-driven type element.

Then the pixel electrode 303 is formed after forming the wiring line 309 to obtain a light emitting device shown in FIG. 3B. In this case, injection of current from the pixel electrode 303 can be improved compared to the structure of FIG. 3A.

In FIGS. 3A and 3B, a forward-tapered bank structure 310 separates the pixels placed in the pixel portion 311 from one another. If this bank structure is reverse-tapered, a contact between the bank structure and the pixel electrode can be avoided. An example thereof is shown in FIG. 4.

Figure 4:
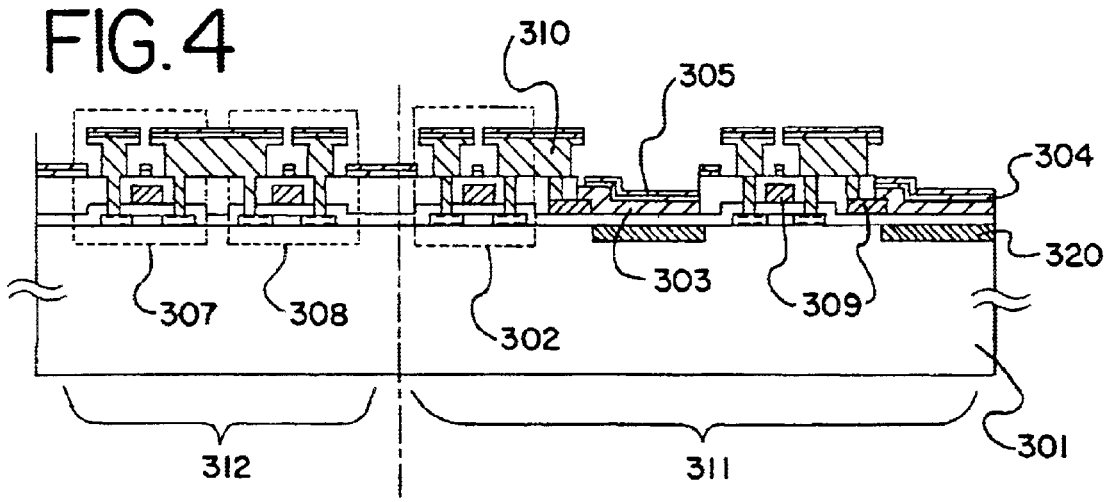
FIG. 4 is a diagram showing the cross sectional structure of a light emitting device.

In FIG. 4, a wiring line also serves as a separation portion, forming a wiring line and separation portion 310. The shape of the wiring line and separation portion 310 shown in FIG. 4 (namely, a structure with eaves) is obtained by layering a metal that constitutes the wiring line and a material lower in etch rate than the metal (a metal nitride, for example) and then etching the laminate. This shape can prevent short circuit between a cathode 305 and a pixel electrode 303 or the wiring line. Unlike a usual active matrix light emitting device, the cathode 305 on the pixel is striped in the device of FIG. 4 (similar to a cathode in a passive matrix device).

Figure 5A:
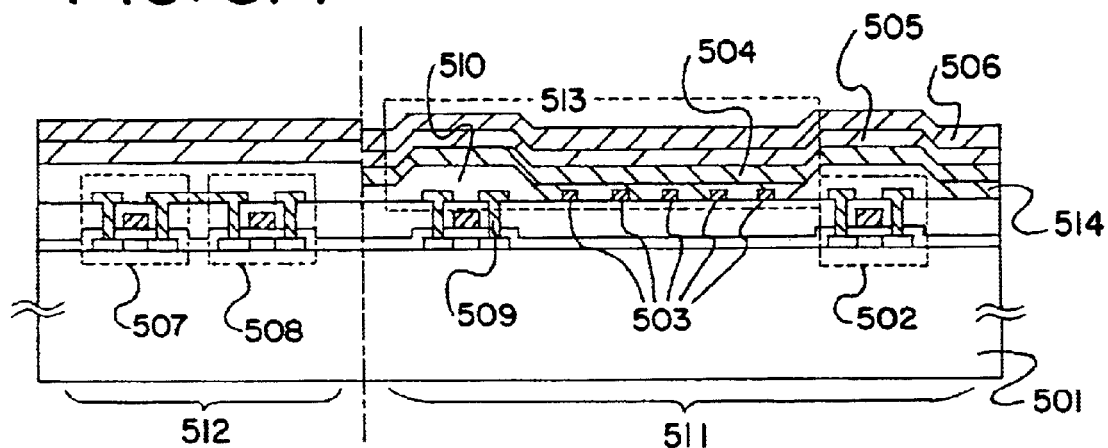
FIGS. 5A and 5B are diagrams showing the cross sectional structure of a light emitting device.
Figure 5B:
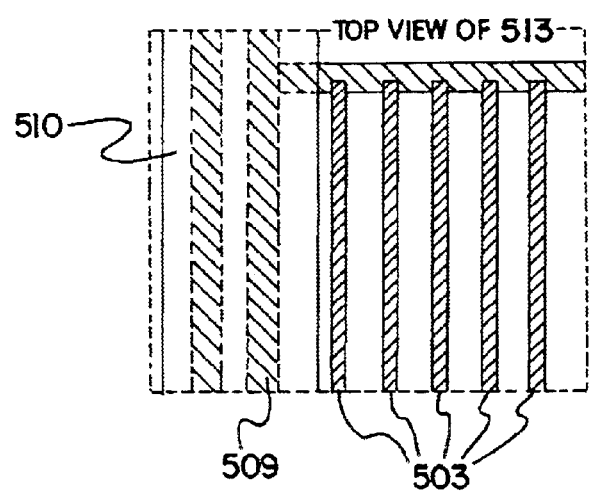

FIG. 5A shows an example in which an electrode structure effective when a conductive polymer material is used for a hole injection region is introduced to an active matrix light emitting device. A sectional view thereof is shown in FIG. 5A. A top view of the electrode structure in each pixel is shown in FIG. 5B. According to the illustrated structure, an anode in each pixel 513 is not formed over the entire surface but is striped and slits are formed between stripes of a striped electrode 513.

When an organic compound film is directly formed on this structure, no light is emitted from the slit where the electrode is not present. However, the entire surface of the pixel emits light if a coat of conductive polymer 514 is placed as shown in FIG. 5A. In other words, the conductive polymer 514 forms a hole injection region and serves as an electrode at the same time.

A merit of the light emitting device as the one in FIGS. 5A and 5B is that it is not necessary to use a transparent material for the anode 503. A sufficient amount of emitted light can be taken out if the aperture ratio of the slit is 80 to 90%. Moreover, the conductive polymer 514 forms a flat surface and therefore uniform electric field is applied to the organic compound film to lower the risk of breakdown.

Figure 6A:
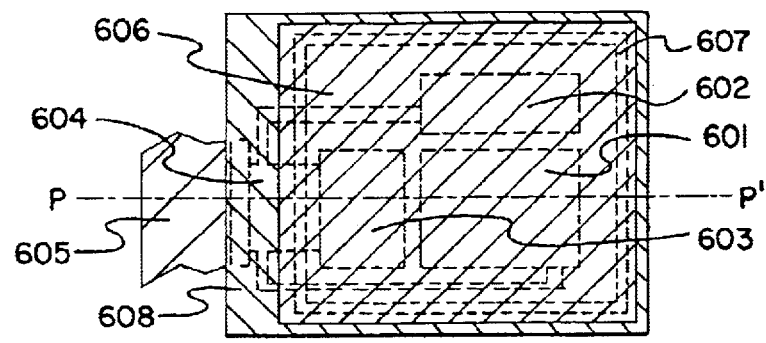
FIGS. 6A and 6B are diagrams showing the top surface structure and the cross sectional structure of a light emitting device.
Figure 6B:
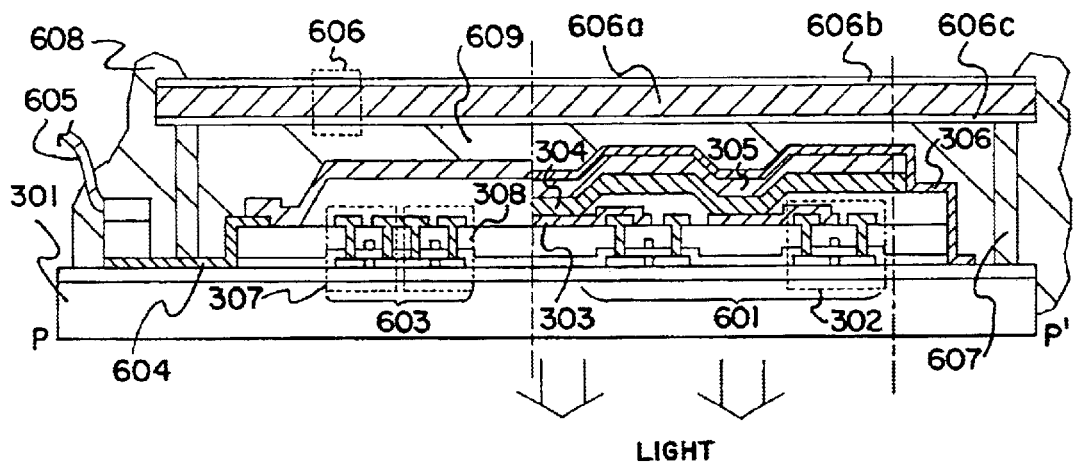

FIGS. 6A and 6B show the exterior of the active matrix light emitting device illustrated in FIG. 3B. FIG. 6A is a top view thereof and FIG. 6B is a sectional view taken along the line P–P' of FIG. 6A. The symbols in FIGS. 3A and 3B are used in FIGS. 6A and 6B.

In FIG. 6A, 601 denotes a pixel portion, 602 denotes a gate signal side driving circuit, and 603 denotes a data signal side driving circuit. Signals to be sent to the gate signal side driving circuit 602 and the data signal side driving circuit are inputted from a TAB (tape automated bonding) tape 605 through an input wiring line 604. Though not shown in the drawing, the TAB tape 605 may be replaced by a TCP (tape carrier package) that is obtained by providing a TAB tape with an IC (integrated circuit).

Denoted by 606 is the cover member that is provided in an upper part of the light emitting device shown in FIG. 3B, and is bonded with a seal member 607 formed of a resin. The cover member 606 may be any material as long as it does not transmit oxygen and water. In this embodiment, as shown in FIG. 6B, the cover member 606 is composed of a plastic member 606a and carbon films (specifically, diamond-like carbon films) 606b and 606c that are formed on the front and back of the plastic member 606a, respectively.

As shown in FIG. 6B, the seal member 607 is covered with a sealing member 608 made of a resin so that the organic light emitting element is completely sealed in an airtight space 609. The airtight space 609 is filled with inert gas (typically, nitrogen gas or noble gas), a resin, or inert liquid (for example, liquid fluorocarbon typical example of which is perfluoro alkane). It is also effective to put an absorbent or deoxidant in the space.

A polarizing plate may be provided on a display face (the face on which an image is displayed to be observed by a viewer) of the light emitting device shown in this embodiment. The polarizing plate has an effect of reducing reflection of incident light from the external to thereby prevent the display face from showing the reflection of a viewer. Generally, a circular polarizing plate is employed. However, it is preferable for the polarizing plate to have a structure with less internal reflection by adjusting the index of refraction in order to prevent light emitted from the organic compound film from being reflected at the polarizing plate and traveling backward.

Any of organic light emitting elements according to the present invention can be used as the organic light emitting element included in the light emitting device of this embodiment.

Embodiment 5

Figure 7:
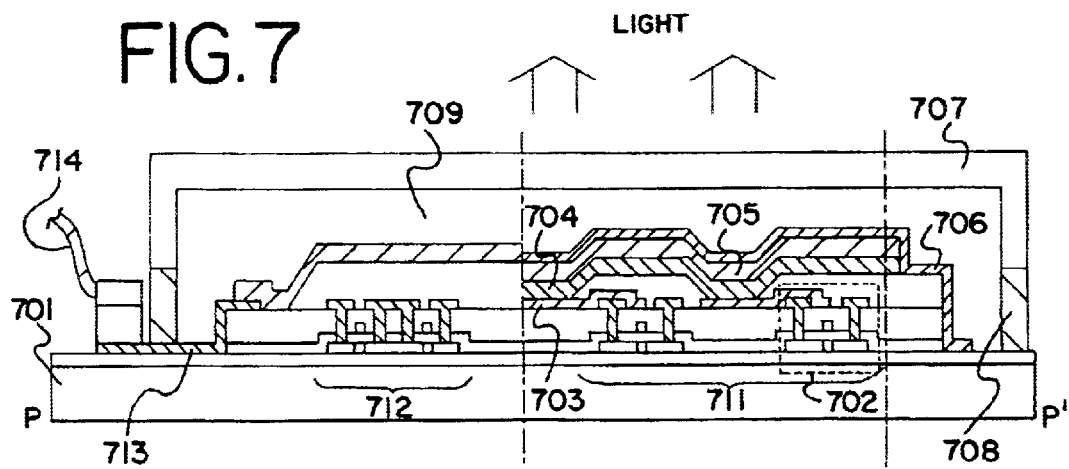
FIG. 7 is a diagram showing the cross sectional structure of a light emitting device.

This embodiment shows an active matrix light emitting device as an example of a light emitting device that includes an organic light emitting element according to the present invention. Unlike Embodiment 4, in the light emitting device of this embodiment, light is taken out from the opposite side of a substrate on which an active element is formed (hereinafter referred to as upward emission). FIG. 7 is a sectional view thereof.

A thin film transistor (hereinafter referred to as TFT) is used here as the active element, but the active element may be a MOS transistor. The TFT shown as an example is a top gate TFT (planar TFT, to be specific), but a bottom gate TFT (typically a reverse stagger TFT) may be used instead.

A substrate 701, a current controlling TFT 702 that is formed in a pixel portion, and a driving circuit 712 of this embodiment have the same structure as those of Embodiment 4.

A first electrode 703, which is connected to a drain of the current controlling TFT 702, is used as an anode in this embodiment, and therefore is formed preferably from a conductive material having a large work function. Typical examples of the conductive material include metals such as nickel, palladium, tungsten, gold, and silver. In this embodiment, the first electrode 703 desirably does not transmit light. More desirably, the electrode is formed from a material that is highly reflective of light.

On the first electrode 703, an organic compound film 704 is formed. Provided on the organic compound film 704 is a second electrode 705, which serves as a cathode in this embodiment. Accordingly, the material of the second electrode 705 is desirably a conductive material having a work function of 2.5 to 3.5 eV. Typically, a conductive film containing an alkaline metal element or an alkaline-earth metal element, or a conductive film containing aluminum, or a laminate obtained by layering an aluminum or silver film on one of the above conductive films is used. However, being light-transmissive is indispensable for the material of the second electrode 705. Therefore, when used for the second electrode, the metal is preferably formed into a very thin film about 20 nm in thickness.

A layer composed of the first electrode 703, the organic compound film 704, and the second electrode 705 is covered with a protective film 706. The protective film 706 is provided to protect the organic light emitting element from oxygen and moisture. In this embodiment, any material can be used for the protective film as long as it transmits light.

The first electrode (anode) 703 is electrically connected to the current controlling TFT 702 in FIG. 7 but the cathode may be connected to the current controlling TFT instead. In this case, the first electrode is formed from the material of the cathode whereas the second electrode is formed from the material of the anode. The current controlling TFT in this case is preferably an n-channel TFT.

Denoted by 707 is a cover member and is bonded with a seal member 708 formed of a resin. The cover member 707 may be any material as long as it transmits light but not oxygen and water. In this embodiment, glass is used. An airtight space 709 is filled with inert gas (typically, nitrogen gas or noble gas), a resin, or inert liquid (for example, liquid fluorocarbon typical example of which is perfluoro alkane). It is also effective to put an absorbent or deoxidant in the space.

Signals to be sent to the gate signal side driving circuit and the data signal side driving circuit are inputted from a TAB (tape automated bonding) tape 714 through an input wiring line 713. Though not shown in the drawing, the TAB tape 714 may be replaced by a TCP (tape carrier package) that is obtained by providing a TAB tape with an IC (integrated circuit).

A polarizing plate may be provided on a display face (the face on which an image is displayed to be observed by a viewer) of the light emitting device shown in this embodiment. The polarizing plate has an effect of reducing reflection of incident light from the external to thereby prevent the display face from showing the reflection of a viewer. Generally, a circular polarizing plate is employed. However, it is preferable for the polarizing plate to have a structure with less internal reflection by adjusting the index of refraction in order to prevent light emitted from the organic compound film from being reflected at the polarizing plate and traveling backward.

Any of organic light emitting elements according to the present invention can be used as the organic light emitting element included in the light emitting device of this embodiment.

Embodiment 6

Figure 8A:
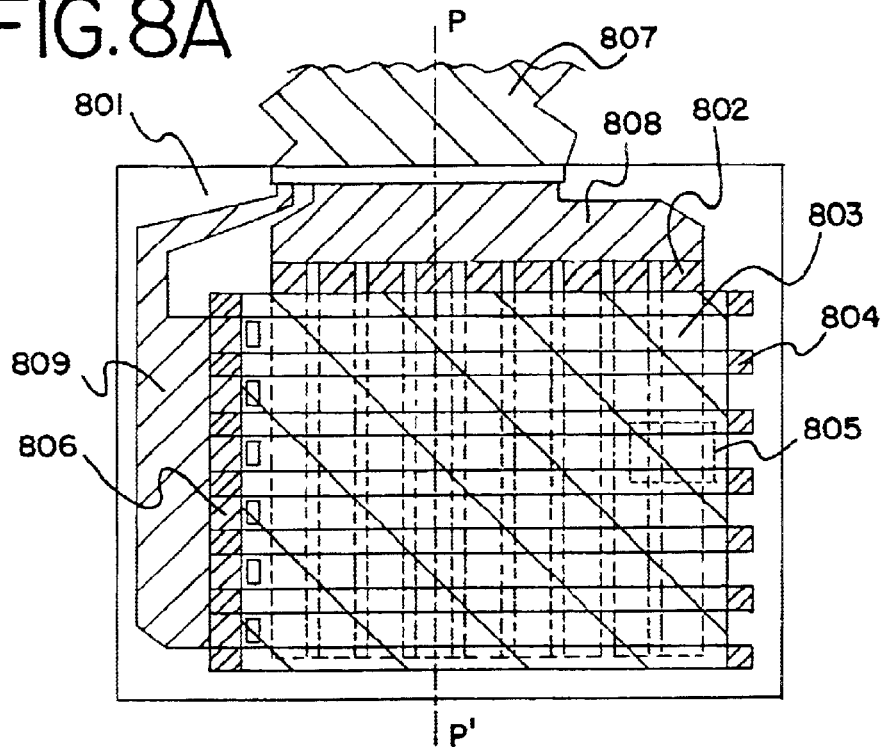
FIG. 8A is a diagram showing the top surface structure of a light emitting device.
Figure 8B:
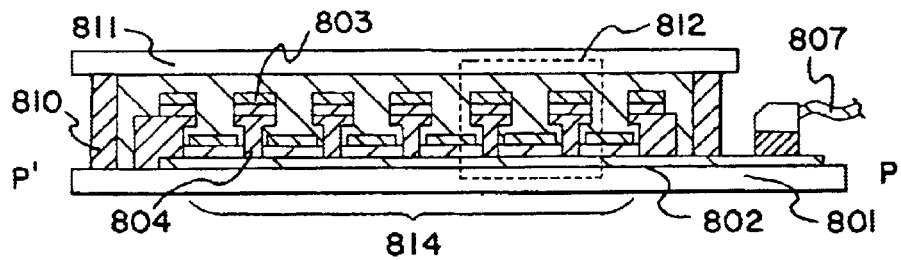
FIGS. 8B and 8C are diagrams showing the cross sectional structure of the light emitting device.

This embodiment shows a passive matrix light emitting device as an example of a light emitting device that includes an organic light emitting element disclosed in the present invention. FIG. 8A is a top view thereof and FIG. 8B is a sectional view taken along the line P–P' of FIG. 8A.

In FIG. 8A, denoted by 801 is a substrate, which is formed of a plastic material here. The plastic material, which can be used is a plate or film of polyimide, polyamide, an acrylic resin, an epoxy resin, PES (polyethylene sulfile), PC (polycarbonate), PET (polyethylene terephthalate), or PEN (polyethylene naphthalate).

802 denotes scanning lines (anodes) formed from a conductive oxide film. In this embodiment, the conductive oxide film is obtained by doping zinc oxide with gallium oxide. 803 denotes data lines (cathodes) formed from a metal film, a bismuth film, in this embodiment. 804 denotes banks formed of an acrylic resin. The banks function as partition walls that separate the data lines 803 from one another. The scanning lines 802 and the data lines 803 respectively form stripe patterns and the patterns cross each other at right angles. Though not shown in FIG. 8A, an organic compound film is sandwiched between the scanning lines 802 and the data lines 803 and intersection portions 805 serve as pixels.

The scanning lines 802 and the data lines 803 are connected to an external driving circuit through a TAB tape 807. 808 denotes a group of wiring lines comprised of a mass of the scanning lines 802. 809 denotes a group of wiring lines comprised of a mass of connection wiring lines 806 that are connected to the data lines 803. Though not shown, the TAB tape 807 may be replaced by TCP that is obtained by providing a TAB tape with an IC.

In FIG. 8B, 810 denotes a seal member and 811 denotes a cover member that is bonded to a plastic member 801 with the seal member 810. A photo-curable resin can be used for the seal member 810. A preferable material of the seal member is one which allows little gas leakage and which absorbs little moisture. The cover member is preferably made from the same material as the substrate 801, and glass (including quartz glass) or plastic can be used. Here, a plastic material is used for the cover member.

Figure 8C:
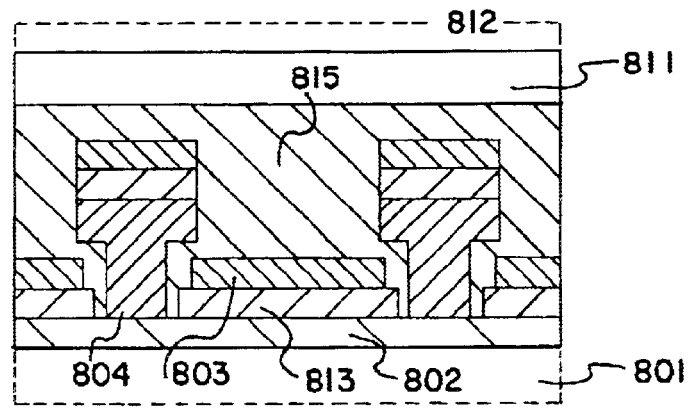

FIG. 8C is an enlarged view of the structure of a pixel region. 813 denotes an organic compound film. Lower layers of the banks 804 are narrower than upper layers and therefore the banks can physically separate the data lines 803 from one another. A pixel portion 814 surrounded by the seal member 810 is shut off of the outside air by a sealing member 815 formed of a resin. Degradation of the organic compound film is thus prevented.

In the light emitting device structured as above in accordance with the present invention, the pixel portion 814 is composed of the scanning lines 802, the data lines 803, the banks 804, and the organic compound film 813. Therefore, the light emitting device can be manufactured by a very simple process.

A polarizing plate may be provided on a display face (the face on which an image is displayed to be observed by a viewer) of the light emitting device shown in this embodiment. The polarizing plate has an effect of reducing reflection of incident light from the external to thereby prevent the display face from showing the reflection of a viewer. Generally, a circular polarizing plate is employed. However, it is preferable for the polarizing plate to have a structure with less internal reflection by adjusting the index of refraction in order to prevent light emitted from the organic compound film from being reflected at the polarizing plate and traveling backward.

Any of organic light emitting elements according to the present invention can be used as the organic light emitting element included in the light emitting device of this embodiment.

Embodiment 7

This embodiment shows an example of attaching a printed wiring board to the light emitting device shown in Embodiment 6 to make the device into a module.

Figure 9A:
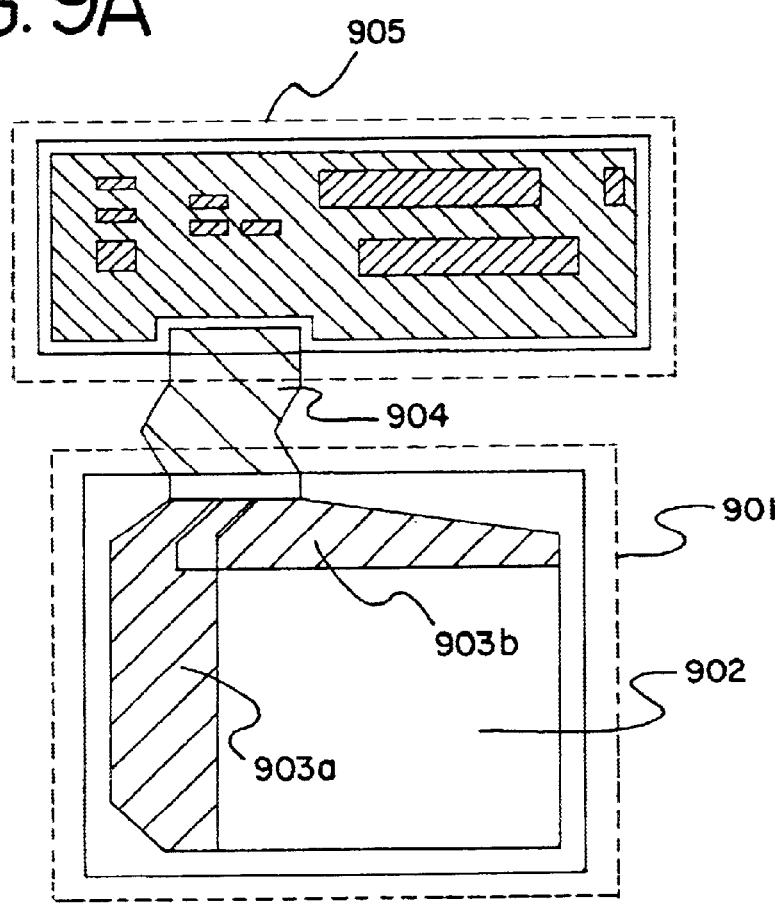
FIGS. 9A and 9B are diagrams showing the structure of a light emitting device.

In a module shown in FIG. 9A, a TAB tape 904 is attached to a substrate 901 (here including a pixel portion 902 and wiring lines 903a and 903b), and a printed wiring board 905 is attached to the substrate through the TAB tape 904.

Figure 9B:
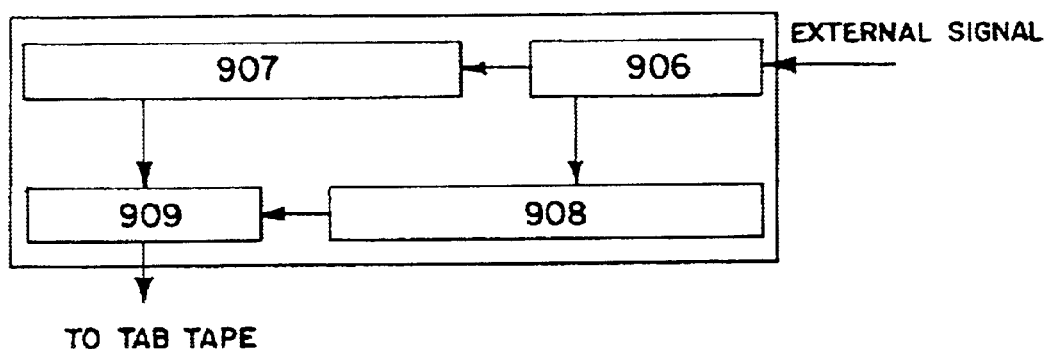

A functional block diagram of the printed wiring board 905 is shown in FIG. 9B. An IC functioning as at least I/O ports (input or output portions) 906 and 909, a data signal side driving circuit 907, and a gate signal side driving circuit 908 are provided within the printed wiring board 905.

In this specification, a module structured by attaching a TAB tape to a substrate with a pixel portion formed on its surface and by attaching a printed wiring board that functions as a driving circuit to the substrate through the TAB tape as above is specially named a module with external driving circuit.

Any of organic light emitting elements disclosed in the present invention can be used as the organic light emitting element included in the light emitting device of this embodiment.

Embodiment 8

This embodiment shows an example of attaching a printed wiring board to the light emitting device shown in Embodiment 4, 5, or 6 to make the device into a module.

Figure 10A:
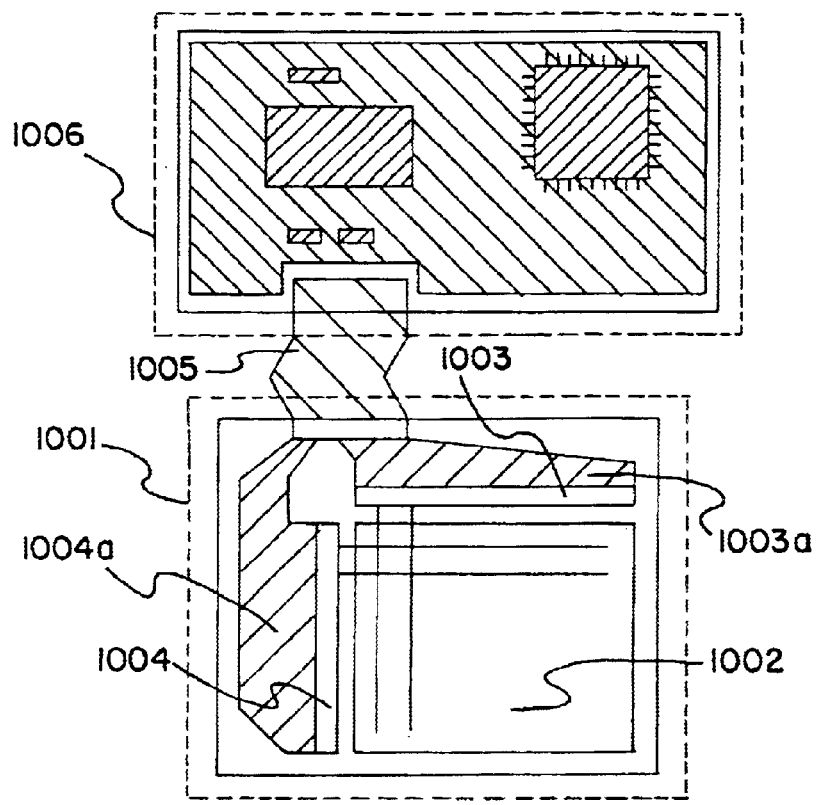
FIGS. 10A and 10B are diagrams showing the structure of a light emitting device.

In a module shown in FIG. 10A, a TAB tape 1005 is attached to a substrate 1001 (here including a pixel portion 1002, a data signal side driving circuit 1003, a gate signal side driving circuit 1004, and wiring lines 1003a and 1004a), and a printed wiring board 1006 is attached to the substrate through the TAB tape 1005. A functional block diagram of the printed wiring board 1006 is shown in FIG. 10B.

Figure 10B:
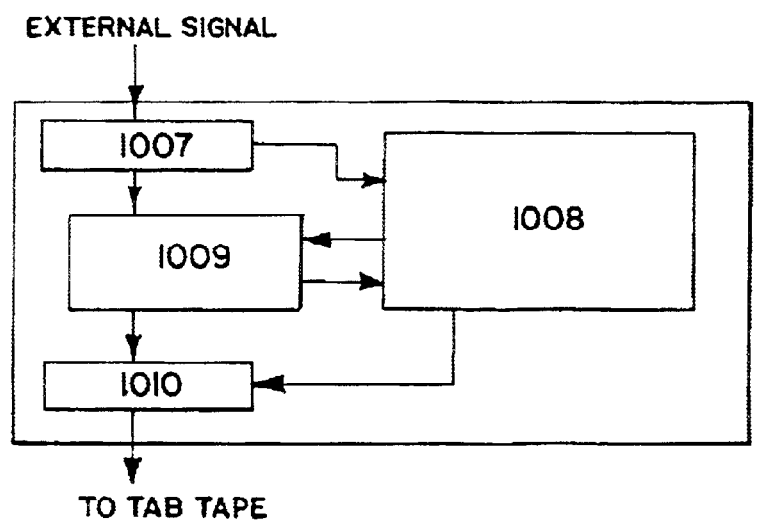

As shown in FIG. 10B, an IC functioning as at least I/O ports 1007 and 1010 and a control unit 1008 is provided within the printed wiring board 1006. A memory unit 1009 is provided here but it is not always necessary. The control unit 1008 is a portion having functions for controlling the driving circuits and correction of image data.

In this specification, a module structured by attaching a printed wiring board that has functions as a controller to a substrate on which an organic light emitting element is formed as above is specially named a module with external controller.

Any of organic light emitting elements disclosed in the present invention can be used as the organic light emitting element included in the light emitting device of this embodiment.

Embodiment 9

This embodiment shows an example of light emitting device in which an organic light emitting element is driven in accordance with digital time gray scale display. The light emitting device of the present invention can provide uniform images in digital time gray scale display and therefore is very useful.

Figure 11A:
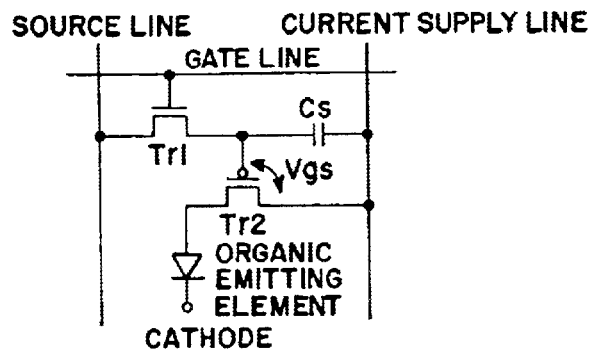
FIGS. 11A to 11C are diagrams showing the structure of a light emitting device.

FIG. 11A shows the circuit structure of a pixel that uses an organic light emitting element. Tr represents a transistor and Cs represents a storage capacitor. In this circuit, when a gate line is selected, a current flows into Tr1 from a source line and a voltage corresponding to the signal is accumulated in Cs. Then a current controlled by the gate-source voltage ($V_{gs}$) of Tr2 flows into Tr2 and the organic light emitting element.

After Tr1 is selected, Tr1 is turned OFF to hold the voltage ($V_{gs}$) of Cs. Accordingly, a current continues to flow in an amount dependent of $V_{gs}$.

Figure 11B:
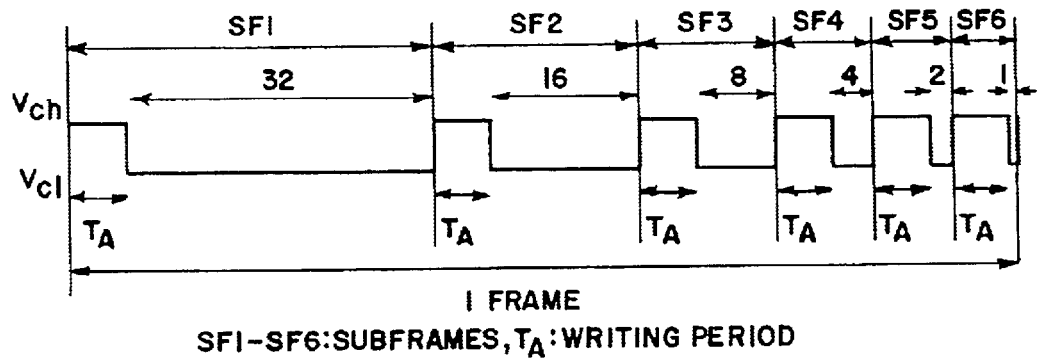

FIG. 11B shows a chart for driving this circuit in accordance with digital time gray scale display. In digital time gray scale display, one frame is divided into plural sub-frames. FIG. 11B shows 6 bit gray scale in which one frame is divided into six sub-frames. In this case, the ratio of light emission periods of the sub-frames is 32:16:8:4:2:1.

Figure 11C:
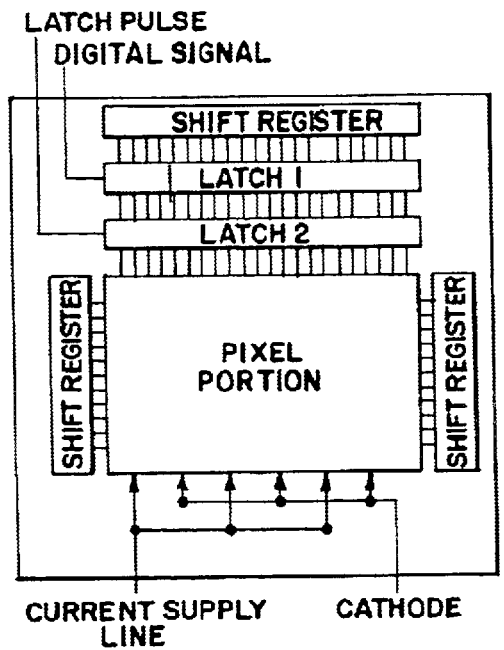

FIG. 11C schematically shows driving circuits of TFT substrate in this embodiment. A gate driver and a source driver are provided on the same substrate. In this embodiment, the pixel circuit and the drivers are designed to be digitally driven. Accordingly, fluctuation in TFT characteristic does not affect the device and the device can display uniform images.

Embodiment 10

The light emitting devices of the present invention, which have been described in, the embodiments above have advantages of low power consumption and low price. Accordingly, electric appliances that include those light emitting devices as their display units can operate consuming less power than conventional ones and can be offered at a low price. The advantages are very useful especially for electric appliances that use batteries as power sources, such as portable equipment, because low power consumption leads directly to conveniences (batteries last longer).

The light emitting device is self-luminous to eliminate the need for back light as the one in liquid crystal displays, and has an organic compound film whose thickness is less than 1 $\mu$m. Therefore, the light emitting device can be made thin and light-weight. Electric appliances that include the light emitting device as their display units are accordingly thinner and lighter than conventional ones. This too leads directly to conveniences (lightness and compactness in carrying them around) and is very useful particularly for portable equipment and like other electric appliances. Moreover, being thin (unvoluminous) is doubtlessly useful for all of the electric appliances in terms of transportation (a large number of appliances can be transported in a mass) and installation (space-saving).

Being self-luminous, the light emitting device is characterized by having better visibility in bright places than liquid crystal display devices and wide viewing angle. Therefore electric appliances that include the light emitting device as their display units are advantageous also in terms of easiness in viewing display.

To summarize, electric appliances that use a light emitting device of the present invention have, in addition to merits of conventional organic light emitting elements, namely, thinness/lightness and high visibility, new features of low power consumption and long lifetime, and therefore are very useful.

This embodiment shows examples of the electric appliances that include as display units the light emitting device of the present invention. Specific examples thereof are shown in FIGS. 12A to 13B. The organic light emitting element included in the electric appliance of this embodiment can be any element according to the present invention. The light emitting device included in the electric appliance of this embodiment can have any of the configurations illustrated in FIGS. 3A to 11C.

Figure 12A:
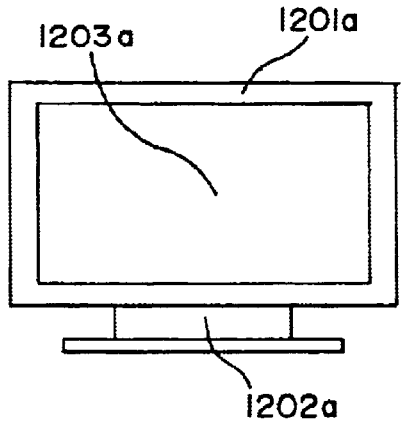
FIGS. 12A to 12F are diagrams showing specific examples of electronic equipment.

FIG. 12A shows a display device using an organic light emitting element. The display is composed of a case 1201a, a support base 1202a, and a display unit 1203a. By using a light emitting device of the present invention as the display unit 1203a, the display can be thin and light-weight, as well as low price. Accordingly, transportation is simplified, space is saved in installation, and price can be cut down.

Figure 12B:
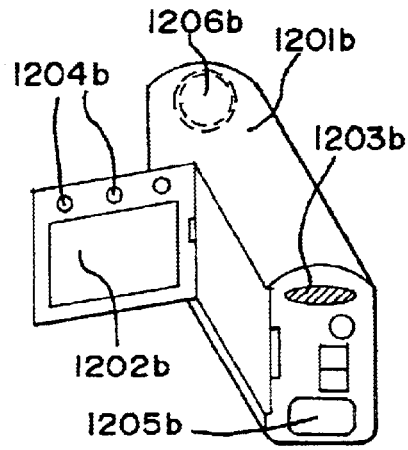

FIG. 12B shows a video camera, which is composed of a main body 1201b, a display unit 1202b, an audio input unit 1203b, operation switches 1203b, a battery 1205b, and an image receiving unit 1206b. By using a light emitting device of the present invention as the display unit 1202b, the video camera can be thin and light-weight, and consumes less power. Accordingly, battery consumption is reduced and carrying the video camera is less inconvenient.

Figure 12C:
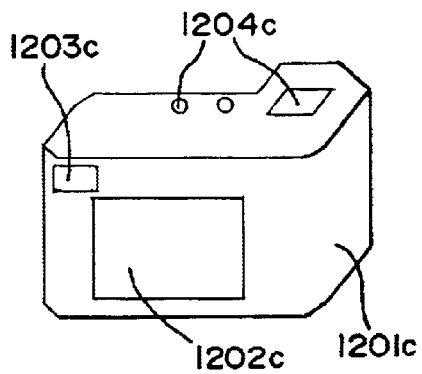

FIG. 12C shows a digital camera, which is composed of a main body 1201c, a display unit 1202c, an eye piece unit 1203c, and operation switches 1204c. By using a light emitting device of the present invention as the display unit 1202c, the digital camera can be thin and light-weight, and consumes less power. Accordingly, battery consumption is reduced and carrying the digital camera is less inconvenient.

Figure 12D:
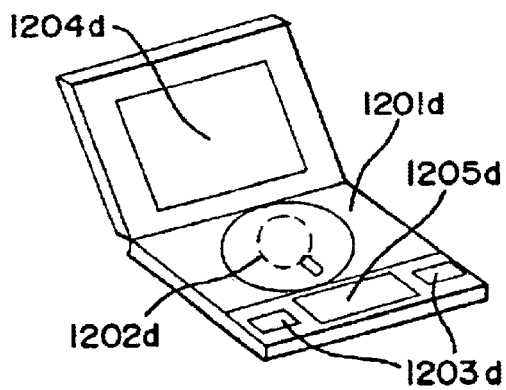

FIG. 12D shows an image reproducing device equipped with a recording medium. The device is composed of a main body 1201d, a recording medium (such as CD, LD, or DVD) 1202d, operation switches 1203d, a display unit (A) 1204d, and a display unit (B) 1205d. The display unit (A) 1204d mainly displays image information whereas the display unit (B) 1205d mainly displays text information. By using a light emitting device of the present invention as the display unit (A) 1204d and the display unit (B) 1205d, the image reproducing device consumes less power and can be thin and light-weight as well as durable. The image reproducing device equipped with a recording medium also includes CD players and game machines.

Figure 12E:
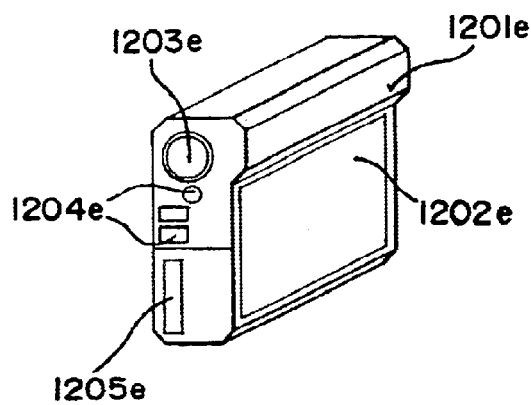

FIG. 12E shows a (portable) mobile computer, which is composed of a main body 1201e, a display unit 1202e, an image receiving unit 1203e, a switch 1204e, and a memory slot 1205e. By using a light emitting device of the present invention as the display unit 1202e, the portable computer can be thin and light-weight, and consumes less power. Accordingly, battery consumption is reduced and carrying the computer is less inconvenient. The portable computer can store information in a flash memory or a recording medium obtained by integrating non-volatile memories and can reproduce the stored information.

Figure 12F:
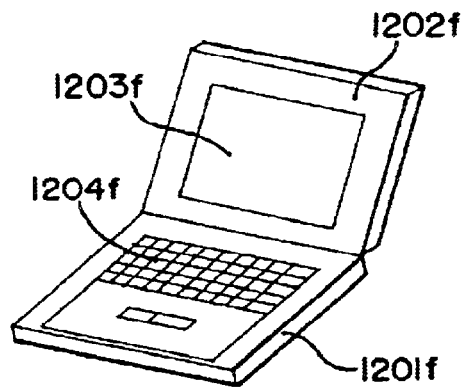

FIG. 12F shows a personal computer, which is composed of a main body 1201f, a case 1202f, a display unit 1203f, and a keyboard 1204f. By using a light emitting device of the present invention as the display unit 1203f, the personal computer can be thin and light-weight, and consumes less power. The light emitting device is a great merit in terms of battery consumption and lightness especially for a notebook personal computer or other personal computers that are carried around.

These electric appliances now display with increasing frequency information sent through electronic communication lines such as the Internet and radio communications such as radio wave, especially, animation information. Since organic light emitting elements have very fast response speed, the light emitting device is suitable for animation display.

Figure 13A:
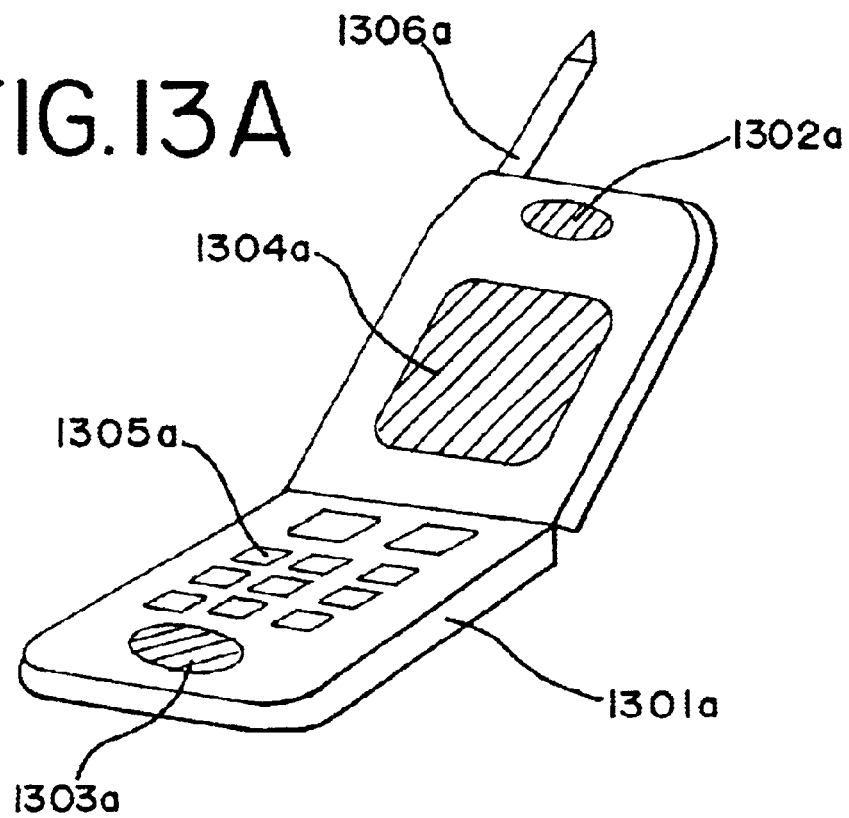
FIGS. 13A and 13B are diagrams showing specific examples of electronic equipment.

FIG. 13A shows a cellular phone, which is composed of a main body 1301a, an audio output unit 1302a, an audio input unit 1303a, a display unit 1304a, operation switches 1305a, and an antenna 1306a. By using a light emitting device of the present invention as the display unit 1304a, the cellular phone can be thin and light-weight, and consumes less power. Accordingly, battery consumption is reduced, carrying the cellular phone is easy, and the main body is compact.

Figure 13B:
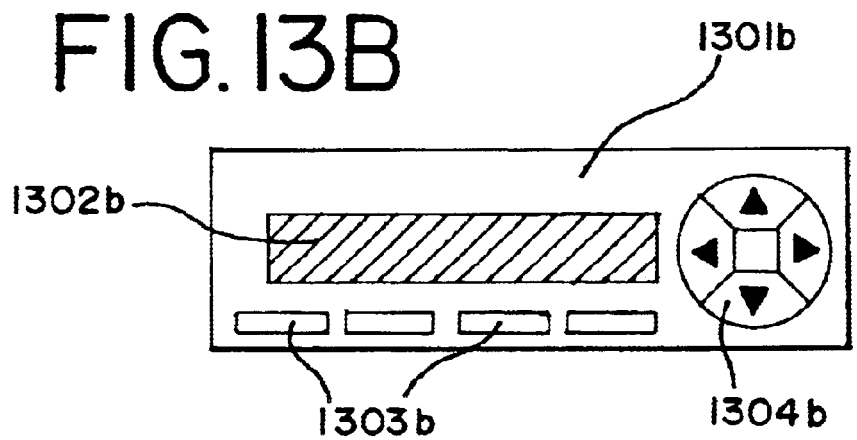

FIG. 13B shows audio (specifically, car audio), which is composed of a main body 1301b, a display unit 1302b, and operation switches 1303b and 1304b. By using a light emitting device of the present invention as the display unit 1302b, the audio can be light-weight, and consumes less power. Although car audio is taken as an example in this embodiment, the audio may be home audio.

It is effective to give the electric appliances shown in FIGS. 12A to 13B a function of modulating the luminance of emitted light in accordance with the brightness of the surroundings where the electric appliances are used by providing the electric appliances with photo sensors as measures to detect the brightness of the surroundings. A user can recognize image or text information without difficulties if the contrast ratio of the luminance of emitted light to the brightness of the surroundings is 100 to 150. With this function, the luminance of an image can be raised for better viewing when the surroundings are bright whereas the luminance of an image can be lowered to reduce power consumption when the surroundings are dark.

Various electric appliances that employ as light sources the light emitting device of the present invention are also thin and light-weight and can operate consuming less power, which makes them very useful appliances. Light sources of liquid crystal display devices, such as back light or front light, or light sources of lighting fixtures are typical uses of the light emitting device of the present invention as a light source.

When liquid crystal displays are used as the display units of the electric appliances shown in FIGS. 12A to 13B according to this embodiment, the electric appliances can be thin and light-weight and consume less power if those liquid crystal displays use as back light or front light the light emitting device of the present invention.

A low cost light emitting device having low electric power consumption can be obtained by implementing the present invention. In addition, low cost electric equipment that is bright and has low electric power consumption can be obtained by using this type of light emitting device as a light source or as a display portion.

What is claimed is:

1. An organic light emitting element comprising an anode, a cathode, and an organic compound layer formed between the anode and the cathode, wherein:

the organic compound layer contains an organic compound expressed by the following general formula:

[Chemical Formula 1]

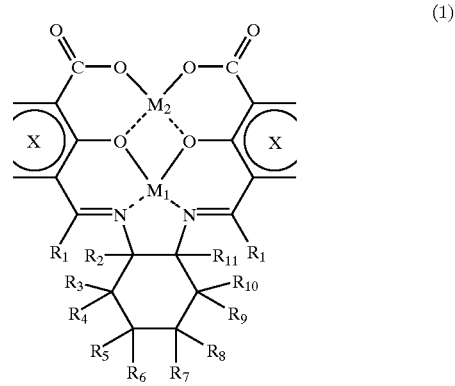

(where: M1 and M2 denote bivalent metallic inns ions or bivalent oxo-metallic ions; X denotes a benzene ring or a fused ring made from a benzene ring, which may have substituents; R1 denotes hydrogen or an alkyl group; and R2 to R11 each denote hydrogen or an alkyl group, and R2 to R11 may all be identical, or may be different).

2. An organic light emitting element comprising an anode, a cathode, and an organic compound layer formed between the anode and the cathode, wherein:

the organic compound layer contains an organic compound expressed by the following general formula:

[Chemical Formula 2]

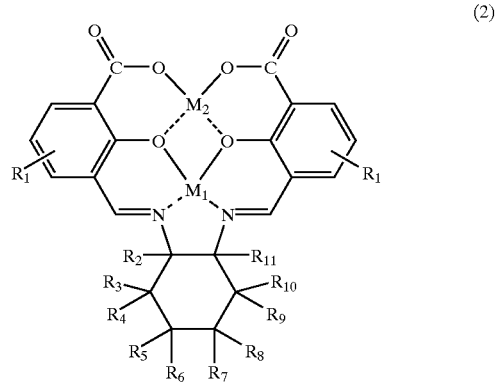

(where: M1 and M2 denote bivalent metallic ions or bivalent oxo-metallic ions; R1 denotes hydrogen, an alkyl group, an alkoxyl group, or aryl group; and R2 to R11 each denote hydrogen or an alkyl group, and R2 to R11 may all be identical, or may be different).

3. An organic light emitting element according to claim 1 or claim 2, wherein M1 and M2 are each metallic ions made from one selected from the group consisting of elements belonging to group 9, group 10, and group 11 of the periodic table.

4. An organic light emitting element according to claim 1 or claim 2, wherein M1 and M2 are oxo-metallic ions made from one selected from the group consisting of elements belonging to group 4, group 5, and group 6 of the periodic table.

5. The organic light emitting element according to claim 1 or claim 2, wherein the organic compound denoted by general formula 1 or by general formula 2 is used as a dopant with respect to the organic compound layer.

6. An organic light emitting element comprising an anode, a cathode, and an organic compound layer formed between the anode and the cathode, wherein:
the organic compound layer contains an organic compound expressed by the following general formula:

[Chemical Formula 3]

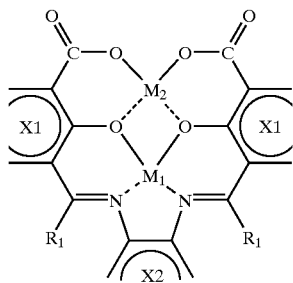

(3)

(where: M1 and M2 denote bivalent metallic ions or bivalent oxo-metallic ions R1 denotes hydrogen or an alkyl group; and X1 and X2 each denote a benzene ring or fused ring made from a benzene ring, which may have substituents, and X1 and X2 may all be identical, or may be different).

7. An organic light emitting element comprising an anode, a cathode, and an organic compound layer formed between the anode and the cathode, wherein:
the organic compound layer contains an organic compound expressed by the following general formula:

[Chemical Formula 4]

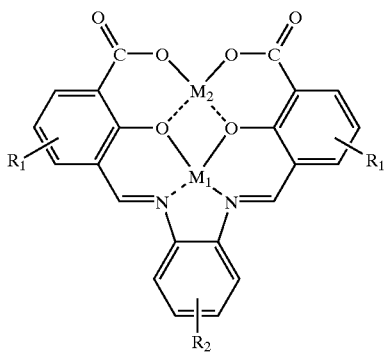

(4)

(where: M1 and M2 denote bivalent metallic ions or bivalent oxo-metallic ions; R1 and R2 denote hydrogen, an alkyl group, an alkoxyl group, or aryl group and R1 and R2 may all be identical, or may be different).

8. An organic light emitting element according to claim 6 or claim 7, wherein M1 and M2 are metallic ions made from one selected from the group consisting of elements belonging to group 9, group 10, and group 11 of the periodic table.

9. An organic light emitting element according to claim 6 or claim 7, wherein M1 and M2 are oxo-metallic ions made from one selected from the group consisting of elements belonging to group 4, group 5, and group 6 of the periodic table.

10. An organic light emitting element according to claim 6 or claim 7, wherein the organic compound denoted by general formula 3 or by general formula 4 is used as a dopant with respect to the organic compound layer.

11. A light emitting device wherein the device employs the organic light emitting element according to claim 1.

12. An organic light emitting element according to claim 1, wherein the organic light emitting element is applied to an electronic apparatus selected from the group consisting of a display device, a video camera, a digital camera, an image reproducing device, a mobile computer, a personal computer, a cellular phone and a car audio.

13. A light emitting device wherein the device employs the organic light emitting element according to claim 2.

14. A light emitting device wherein the device employs the organic light emitting element according to claim 6.

15. A light emitting device wherein the device employs the organic light emitting element according to claim 7.

16. An organic light emitting element according to claim 2, wherein the organic light emitting element is applied to an electronic apparatus selected from the group consisting of a display device, a video camera, a digital camera, an image reproducing device, a mobile computer, a personal computer, a cellular phone and a car audio.

17. An organic light emitting element according to claim 6, wherein the organic light emitting element is applied to an electronic apparatus selected from the group consisting of a display device, a video camera, a digital camera, an image reproducing device, a mobile computer, a personal computer, a cellular phone and a car audio.

18. An organic light emitting element according to claim 7, wherein the organic light emitting element is applied to an electronic apparatus selected from the group consisting of a display device, a video camera, a digital camera, an image reproducing device, a mobile computer, a personal computer, a cellular phone and a car audio.

* * * * *